United States Patent [19]
Donde et al.

[11] Patent Number: 5,904,776
[45] Date of Patent: *May 18, 1999

[54] CONDUITS FOR FLOW OF HEAT TRANSFER FLUID TO THE SURFACE OF AN ELECTROSTATIC CHUCK

[75] Inventors: Arik Donde, Dallas, Tex.; Dan Maydan, Los Altos Hills, Calif.; Robert J. Steger, Cupertino, Calif.; Edwin C. Weldon, Los Gatos, Calif.; Brian Lue, Mountain View, Calif.; Timothy Dyer, Tempe, Ariz.

[73] Assignee: Applied Materials, Inc., Santa Clara, Calif.

[ * ] Notice: This patent is subject to a terminal disclaimer.

[21] Appl. No.: 08/924,976

[22] Filed: Sep. 8, 1997

Related U.S. Application Data

[63] Continuation of application No. 08/639,596, Apr. 26, 1996, Pat. No. 5,720,818.

[51] Int. Cl.⁶ .................................................. C23C 16/00
[52] U.S. Cl. ..................... 118/500; 118/715; 118/723 E; 118/725; 118/728; 156/345
[58] Field of Search ............................ 156/345; 118/715, 118/723 E, 725, 728, 500; 29/592.1, 428, 458

[56] References Cited

U.S. PATENT DOCUMENTS

| | | | |
|---|---|---|---|
| 5,270,266 | 12/1993 | Hirano et al. | 437/228 |
| 5,315,473 | 5/1994 | Collins et al. | 361/234 |
| 5,350,479 | 9/1994 | Collins et al. | 156/345 |

FOREIGN PATENT DOCUMENTS 0 601 788   12/1993   European Pat. Off. ........ C23C 14/50

OTHER PUBLICATIONS

U.S. Patent Application Serial No. 08/372,177 of Collins et al., filed Jan. 12, 1995.

*Primary Examiner*—Richard Bueker
*Attorney, Agent, or Firm*—Shirley L. Church

[57] ABSTRACT

The present invention discloses a two basic structures (including multiple variations within one of the basic structures) and methods for fabrication of the structures which facilitate the flow of cooling gas or other heat transfer fluid to the surface of an electrostatic chuck. The basic structures address both the problem of breakdown of a heat transfer gas in an RF plasma environment and the problem of arcing between a semiconductor substrate and the conductive pedestal portion of the electrostatic chuck in such an RF plasma environment.

12 Claims, 8 Drawing Sheets

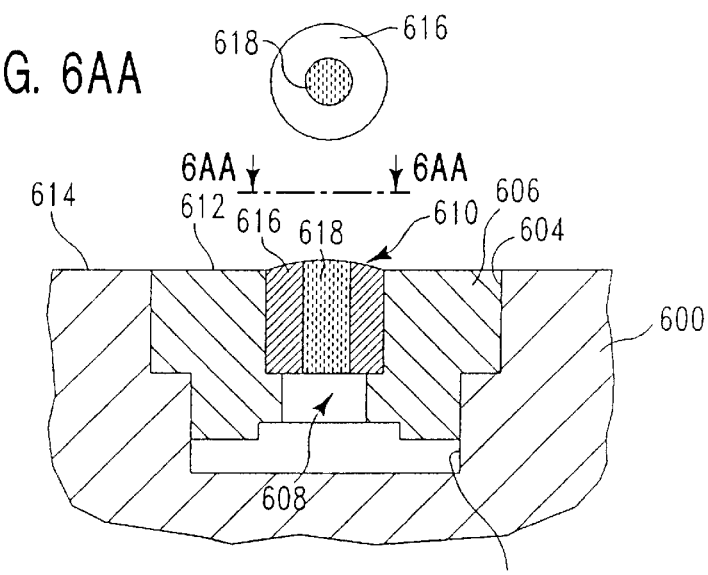
FIG. 6AA
FIG. 6A
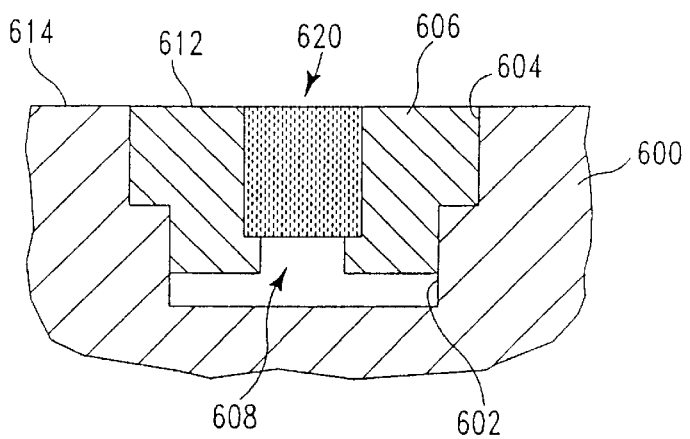
FIG. 6B
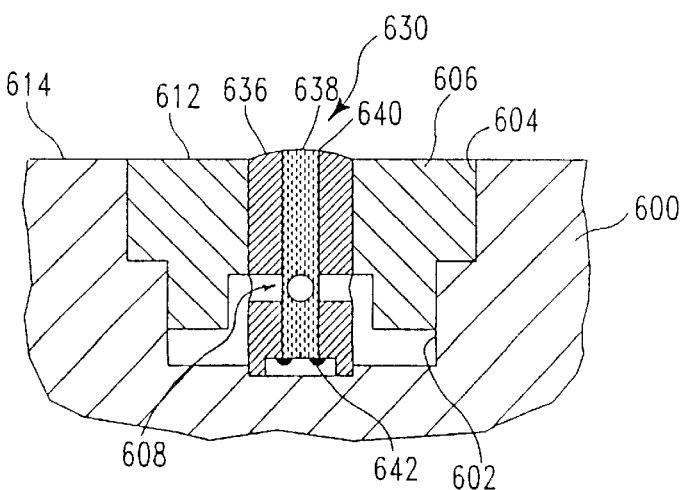
FIG. 6C

CONDUITS FOR FLOW OF HEAT TRANSFER FLUID TO THE SURFACE OF AN ELECTROSTATIC CHUCK

This application is a continuation of prior U.S. application Ser. No. 08/639,596, filing date Apr. 26, 1996, now U.S. Pat. No. 5,720,818.

BACKGROUND OF THE INVENTION

1. Field of the Invention

The present invention pertains to a dielectric structure which serves as a conduit for the flow of heat transfer fluid to an upper surface of an electrostatic chuck. The dielectric structure comprises a dielectric insert which is typically used in combination with at least a portion of a dielectric layer which forms the upper surface of the electrostatic chuck. The dielectric structure prevents breakdown of the heat transfer fluid fed through the electrostatic chuck to its surface to cool a bottom surface of a work piece such as a silicon wafer which is supported upon the upper surface of the electrostatic chuck. The dielectric structure also prevents a semiconductor processing plasma from penetrating into the heat transfer fluid openings in the electrostatic chuck.

2. Brief Description of the Background Art

U.S. Pat. No. 5,350,479 to Collins et al. issued Sep. 27, 1994, and hereby incorporated by reference, describes an electrostatic chuck for holding an article (typically a semiconductor substrate) to be processed in a plasma reaction chamber. The electrostatic chuck includes a metal pedestal coated with a layer of dielectric material which contains a system for distributing a cooling gas upon the upper surface of the electrostatic chuck so that it contacts the bottom of an article supported on that surface. The gas distribution system includes a plurality of intersecting grooves formed entirely in the upper surface of the electrostatic chuck, with small gas distribution holes through intersections of the grooves.

The lifetime of an electrostatic chuck is affected by the presence of the gas distribution holes used to facilitate the distribution of heat transfer gas. In particular, when the electrostatic chuck is subjected to high power RF fields and high density plasmas immediately above the semiconductor substrate, it is possible to have breakdown of the cooling gas due to arcing or glow discharge. Further, since there is a direct, straight line path between the semiconductor substrate supported on the upper, dielectric surface of the electrostatic chuck and an underlying conductive layer of aluminum which forms the pedestal of the electrostatic chuck, arcing can occur along this path. Arcing or glow discharge at the surface of the semiconductor substrate can result in loss of the substrate. In addition, arcing or glow discharge within the gas distribution holes deteriorates the dielectric layer and underlying aluminum layer.

Collins et al. recommends that the aluminum layer beneath the dielectric layer be cut back (away) beneath the dielectric layer immediately adjacent the gas distribution hole to reduce the possibility of arcing across the straight line path from the semiconductor substrate to the aluminum layer. Although this reduces the possibility of arcing, it does not provide the desired isolation of the conductive electrostatic chuck from the process plasma.

U.S. Pat. No. 5,315,473 to Collins et al., issued May 24, 1994, and hereby incorporated by reference, describes methods of improving the clamping force of the electrostatic chuck among other features. In particular, the composition of the dielectric material and the thickness of the dielectric layer are among the critical factors in determining the clamping force. Since it is not yet practical to produce a dielectric layer which is totally flat, there are spacial gaps to be overcome. Generally, the thinner the dielectric layer, the greater the clamping force, all other factors held constant. However, there are practical limitations which limit the ultimate thickness of the dielectric layer. For dielectric layers approximately 1 mil or less in thickness, it has been found that the dielectric material breaks down and loses its insulating properties at voltages required to overcome the spacial gaps between the semiconductor substrate and the upper surface of the electrostatic chuck.

European Patent Application No. 93309608.3 of Collins et al., published Jun. 14, 1994, and hereby incorporated by reference, describes the construction of an electrostatic chuck of the kind disclosed in U.S. Pat. No. 5,350,479 referenced above. The construction of the electrostatic chuck includes grit blasting of the aluminum pedestal, followed by spraying (e.g. plasma-spraying) a dielectric material such as alumina or alumina/titania upon the grit-blasted surface of the aluminum pedestal. Typically the sprayed dielectric thickness is greater than the desired final thickness, by about 15–20 mils (380–508 microns). After the dielectric material has been applied, the thickness is reduced by grinding until it has the desired final thickness, for example, of about 7 mils (180 microns). The upper surface of the dielectric layer is then processed to provide a pattern of heat transfer gas distribution grooves over the surface of the layer. Perforations are created through the dielectric layer to connect the heat transfer gas distribution grooves with gas distribution cavities contained in the pedestal of the electrostatic chuck. In some instances, the perforations in the upper surface of the underlying aluminum pedestal which lead to gas distribution cavities within the pedestal are prepared in advance of application of the dielectric layer. In other instances, the perforations in the upper surface of the aluminum pedestal are prepared simultaneously with the perforations through the dielectric layer.

The cooling gas distribution grooves in the surface of the dielectric layer can be produced using laser micro machining or by using a grinding wheel. The perforations through the dielectric layer are formed using a mechanical drill or a laser. A preferred laser is an excimer UV laser (i.e. a short wave-length, high energy laser) run at a relatively low time averaged power level. This helps reduce the redepositing of drilled aluminum from the underlying thin layer onto the walls of the perforations and onto the surface of the dielectric. Presence of such aluminum can cause arcing across the dielectric layer. The perforations are frequently placed around the outer perimeter of the surface of the electrostatic chuck. For an electrostatic chuck used with an 8 inch (200 mm) silicon wafer electrostatic chuck, the number of such perforations generally ranges from about 150 to about 300. The number of perforations depends on the amount of heat transfer load, and the heat transfer fluid flow rate required to handle this load. Typically the perforations are configured in a ring-like structure around the outer perimeter of the electrostatic chuck. A typical perforation has a diameter which is approximately 0.007±0.001 inch (0.175±0.025 mm).

While micro-drilling through the dielectric layer overlaying the aluminum pedestal to provide the perforations described above provides a satisfactory gas passage, it fails to address the problem of the RF plasma environment that seeks the interface between the dielectric alumina coating and the aluminum substrate. Frequently the underlying aluminum works its way up the sidewalls of the opening(s) in the dielectric layer, leading to arcing and plasma glow within the opening(s). Moreover, depending on the method used to form the perforations, the lower portion of the hole may become a metallic conductor (aluminum) despite the use of a high aspect ratio (depth/diameter) for the gas passage. The removal of machined micro chips slurry from the distribution hole is a difficult task, and is compounded by any migration of aluminum particles up through the dielectric gas distribution hole during drilling and subsequent manufacturing operations such as cleaning of passageways. Presence of machined micro chips slurry is a source of contaminant in the micro electronic environment and may even block the holes in a manner that reduces or stops heat transfer gas flow.

In light of the above, there is a need for a structure which significantly reduces the possibility of breakdown of the cooling gas due to arcing or glow discharge. Further, there is a need for a structure which significantly reduces the possibility of arcing between a semiconductor substrate and the metallic pedestal portion of the electrostatic chuck on which the semiconductor substrate is supported.

SUMMARY OF THE INVENTION

The present invention discloses embodiments of two different kinds of structures (including multiple variations within the basic structure) and methods for fabrication of the structures which facilitate the flow of cooling gas or other heat transfer fluid to the surface of an electrostatic chuck. The embodiments of the present invention which follow address both the problem of the breakdown of a heat transfer gas in an RF plasma environment and the problem of arcing between a semiconductor substrate and the conductive pedestal portion of the electrostatic chuck in such an RF plasma environment.

A first preferred embodiment of the heat transfer fluid conduit structure of the present invention includes an underlying conductive layer which contains at least one heat transfer fluid (typically a gas) pathway, at least one isolating dielectric insert which is in contact with and operates to isolate at least a portion of the underlying conductive layer from the heat transfer fluid pathway, and an overlying dielectric layer which overlies at least portions of the conductive layer, and in some instances, at least a portion of the isolating dielectric insert as well. The overlying dielectric layer comprises at least one opening connected to the heat transfer fluid pathway of the underlying conductive layer and isolating dielectric insert. The basic structure provides an insulative dielectric layer as the upper surface of the electrostatic chuck and improves the isolation of the underlying conductive layer of the electrostatic chuck from an RF plasma which seeks the interface between the dielectric layer upper surface and the underlying conductive layer of the electrostatic chuck.

A method of forming the first preferred embodiment of the present invention, described above, is as follows: a conductive layer containing a heat transfer fluid passageway is provided; at least one dielectric insert is placed into a counter sunk hole or other cavity in the conductive layer (typically the pedestal of the electrostatic chuck), in a manner such that the dielectric insert operates in cooperation with the conductive layer to provide a fluid flow passageway; and, a layer of dielectric material is applied over the surface of the insert and adjacent exposed conductive layer. The dielectric layer is then processed (typically ground or otherwise ablated) back to provide the desired thickness of dielectric layer while optionally exposing at least a portion of the dielectric insert. Preferably, the dielectric insert comprises at least one through hole which is exposed during the processing of the overlying dielectric layer. In the alternative, an opening through the dielectric insert and overlying dielectric layer can be drilled subsequent to processing of the dielectric layer or formed using a removable insert or mask which prevents the dielectric layer from entering the opening in the insert during application of the dielectric layer. When the shape of the insert is such that it would not be locked in place by the dielectric layer if exposed during processing of the dielectric layer, the dielectric layer material can be removed to a particular depth within the layer, and a hole can then be drilled through the dielectric layer to connect with a fluid flow passageway within the insert, where the hole drilled is smaller than the insert, leaving the insert entrapped under the dielectric layer. If the dielectric insert contains no passageway, the opening through the dielectric layer and the passageway through the dielectric insert can be created simultaneously.

A second preferred embodiment of the heat transfer fluid conduit structure of the present invention includes an underlying conductive layer which contains at least one heat transfer fluid pathway; at least one dielectric insert which is disposed in the heat transfer fluid pathway and cooperates with the underlying conductive layer to control the spacial opening between the dielectric insert and the heat transfer fluid pathway in a manner which reduces the possibility of plasma penetration into said pathway; and an overlying dielectric layer which overlies at a portion of the conductive layer. The overlying dielectric layer comprises at least one opening connected to the heat transfer fluid pathway of the underlying conductive layer. The basic structure provides an insulative dielectric layer as the upper surface of the electrostatic chuck and improves the insulation of the underlying conductive layer of the electrostatic chuck from an RF plasma by controlling the spacial opening through which the plasma must seek the underlying conductive layer.

A method of forming the second preferred embodiment heat fluid transfer structure of the present invention, described above, is as follows: A conductive layer comprising a buried heat transfer fluid channel is provided; at least one opening is then created through the conductive layer to connect with the buried heat transfer fluid channel; a space-holding, masking pin is then placed inside the opening; a layer of dielectric material is applied over the surface of the conductive layer and the masking pin; the masking pin is removed; a bonding material is applied within a limited portion of the buried heat transfer fluid channel directly beneath the opening through the conductive layer and the dielectric layer; a dielectric pin is inserted through openings in the dielectric layer and the conductive layer to reach the bonding material; and, the dielectric pin is bonded within the buried heat transfer fluid channel.

Typically, the conductive layer is an aluminum pedestal, the dielectric insert is constructed from a material such as alumina, and the overlaying dielectric layer is applied by spray coating alumina or alumina/titania over the surface of the aluminum pedestal and the dielectric insert (or the space-holding, masking insert, depending on the embodiment of the invention). Other materials of construction than those named here can be used so long as they meet electrical requirements, are compatible with adjacent fluid chemical and physical conditions, and the relative thermal coefficients of expansion do not create problems in the integrity of the electrostatic chuck after multiple thermal cycles in the intended plasma processing environment.

BRIEF DESCRIPTION OF THE DRAWING

FIGS. 6A and 6AA show a dielectric insert which comprises a solid dielectric sleeve with a porous dielectric center core through which the cooling gas flows.

FIG. 6B illustrates a dielectric insert which is completely porous so that cooling gas flows from the underlying gas channel through the entire insert. FIG. 6B is very similar to FIG. 4C.

FIG. 6C shows a dielectric insert which includes a solid dielectric sleeve adjacent the metallic gas flow channel and a solid dielectric center plug, with an annular gas flow opening between the sleeve and the center plug. The rate of gas flow can be controlled by specifically sizing the dielectric center plug, thus controlling the size of the annular gas flow opening.

DETAILED DESCRIPTION OF THE PROFFERED EMBODIMENTS

The present invention pertains to structures and methods for fabrication of the structures which facilitate the flow of cooling gas or other heat transfer fluid to the surface of an electrostatic chuck. The structures address both the problem of the breakdown of a heat transfer gas in an RF plasma environment and the problem of arcing between a semiconductor substrate and the conductive pedestal portion of the electrostatic chuck in such an RF plasma environment.

Figure 1:
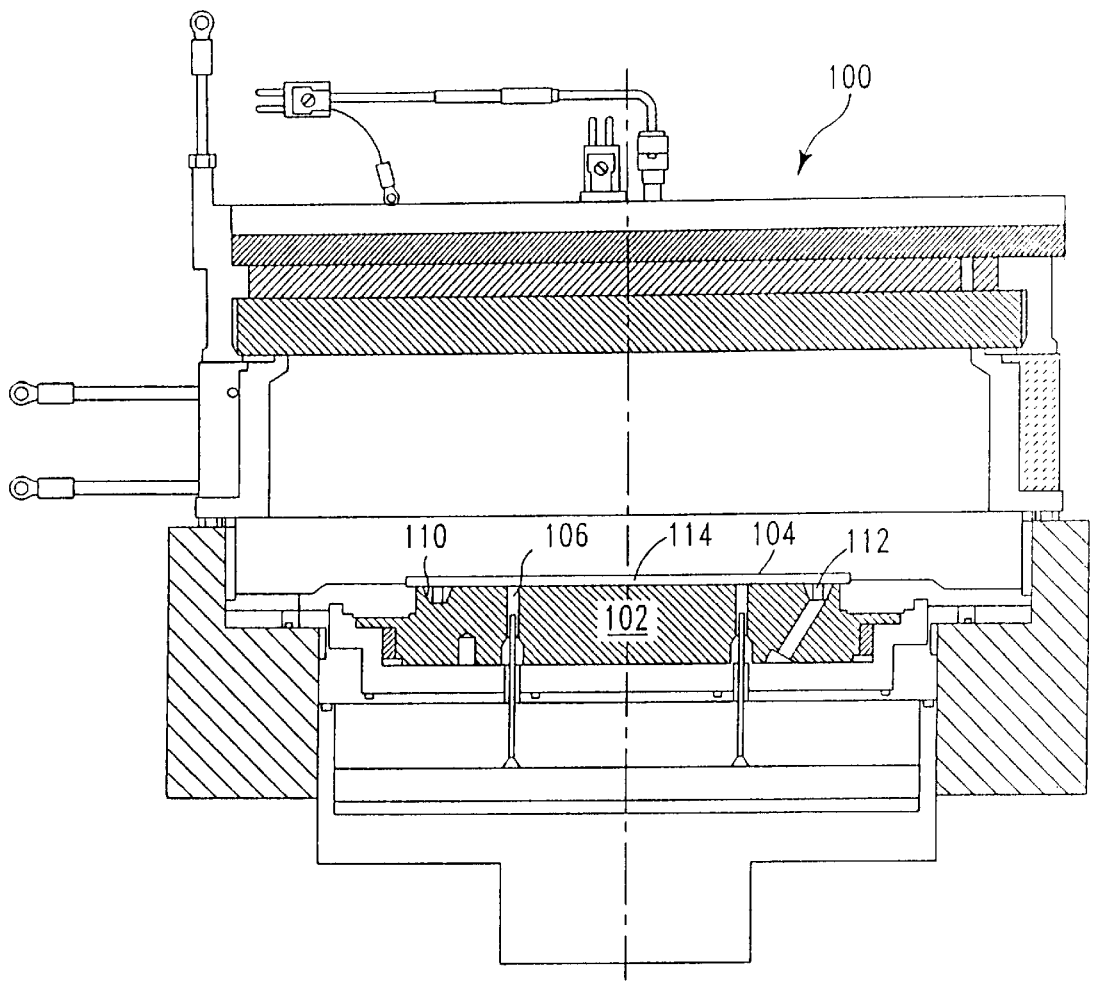
FIG. 1 illustrates a typical plasma etch processing chamber with an electrostatic chuck in place within the chamber.
Figure 2C:
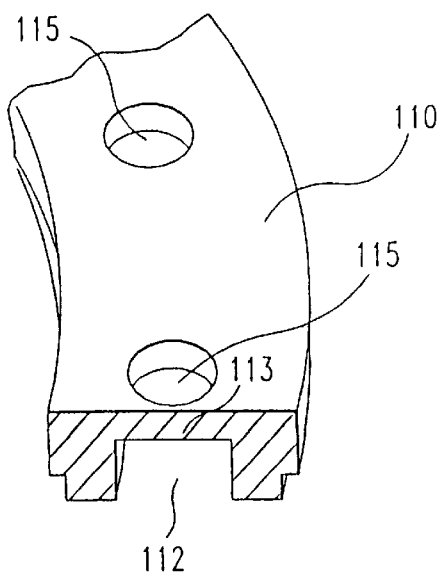
FIG. 2C illustrates a perspective and partial cross-sectional view of a conductive ring insert which can be used to provide a buried gas flow channel within an electrostatic chuck pedestal.

As shown in FIG. 1, a plasma processing chamber 100 contains electrostatic chuck 102 which electrostatically clamps semiconductor substrate 104 (typically a semiconductor wafer) in position within chamber 100 during processing. Lift finger openings 106 penetrating the electrostatic chuck 102 allow lift fingers (not shown) to pass therethrough, to lift a semiconductor wafer off the upper surface of electrostatic chuck 102 once the power has been turned off and the clamping force terminated. Electrostatic chuck 102 also includes gas flow openings 202 which are illustrated in FIG. 2 as being present in an annular (typically conductive, metallic) insert 110 near the periphery of electrostatic chuck 102; the insert 110 having a gas flow channel 112 machined into its underside. The gas flow openings need not be present in an annular configuration, but this is preferred. In addition, it is possible to have more than one annular insert present within electrostatic chuck 102. Gas flow channel 112 traverses annular metallic insert 110 to within close proximity of its upper surface, leaving a thin layer of metal 113 (shown in FIG. 2C) separating dielectric layer 114 from channel 112. Annular insert 110 is sealed to adjacent surfaces within electrostatic chuck 102.

Figure 2A:
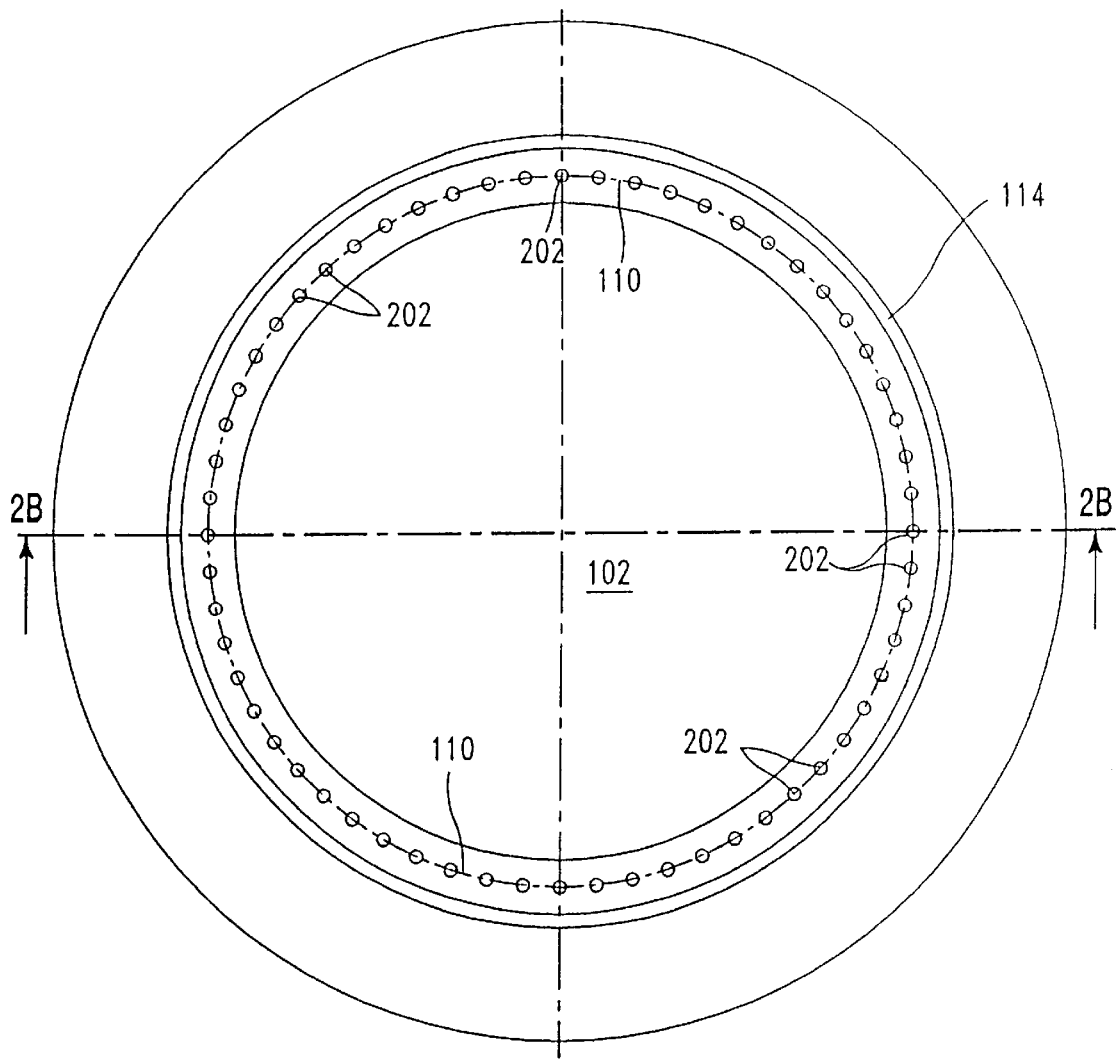
FIG. 2A shows a schematic of a typical electrostatic chuck, including gas distribution holes or perforations arranged around the peripheral edge of the electrostatic chuck.
Figure 2B:
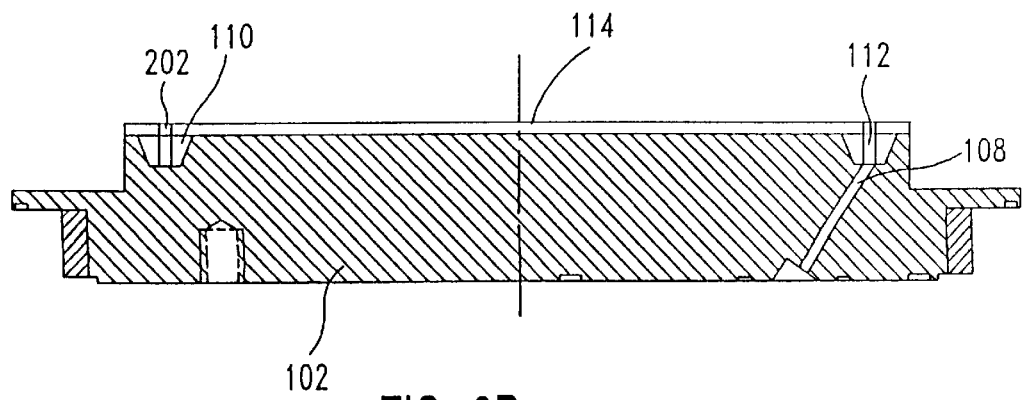
FIG. 2B shows a schematic of a side view of the electrostatic chuck of FIG. 2A, including a flow path for cooling gas.

As shown in the top plan view of FIG. 2A and the associated cross-section of FIG. 2B, a plurality of through holes 202 penetrate dielectric layer 114 to connect with gas flow channel 112 passing circumferentially around the outer periphery of electrostatic chuck 102. FIG. 2B illustrates that cooling gas can then be fed through a conduit 108, penetrating from the bottom of the electrostatic chuck 102, passing into gas flow channel 112 and exiting at through hole 202 onto dielectric surface 114 of electrostatic chuck 102. When grooves (not shown) are machined or otherwise formed into the dielectric surface 114 of electrostatic chuck 102 so that they intersect with through holes 202, cooling gas can proceed from through holes 202 and into such grooves which distribute cooling gas over the entire upper surface of electrostatic chuck 102.

FIG. 2C illustrates in perspective and partial cross-section, the (typically conductive) insert ring 110, showing in more detail gas flow channel 112 and a plurality of holes 115 formed through the a thin layer (typically metallic) 113, which forms the roof of flow channel 112, to provide a path for heat transfer gas flow. Gas flow channel 112 extends upwardly within annular insert 110 to within close proximity of its upper surface, leaving the thin layer of metal 113 separating an overlying dielectric layer 114 from gas flow channel 112. The plurality of holes 115 may be bored through the thin layer of metal 113 to provide a gas flow path prior to the application of overlying dielectric layer 114. In the alternative, holes 115 may be formed after the application of dielectric layer 114 by boring holes through the dielectric layer 114 and thin metallic layer 113 simultaneously.

Figure 4A:
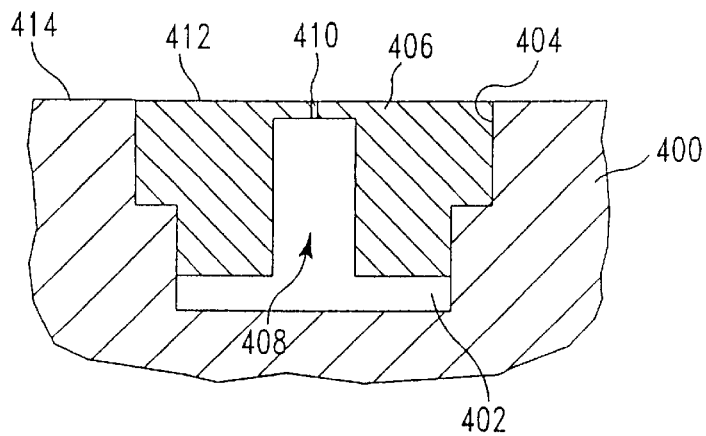
FIG. 4A illustrates a prior art cooling gas distribution system including a gas flow channel created by insertion of a conductive (typically metallic), pre-shaped annular ring into a conductive layer of the electrostatic chuck (typically the electrostatic chuck pedestal). The dielectric surface layer (not shown) of the electrostatic chuck is applied over the surface of the annular conductive ring, and connecting gas flow openings through the dielectric surface layer to the underlying gas flow channel are drilled through the dielectric layer.

FIG. 4A shows a cross-sectional schematic of the prior art heat transfer gas flow system in which insert 406 (which may be an individual insert or may be a ring-shaped insert 110 of the kind shown in FIGS. 2B and 2C) works in combination with pedestal 400 of an electrostatic chuck (such as that shown as 102 in FIG. 1) to provide a gas flow channel 408.

Figure 3A:
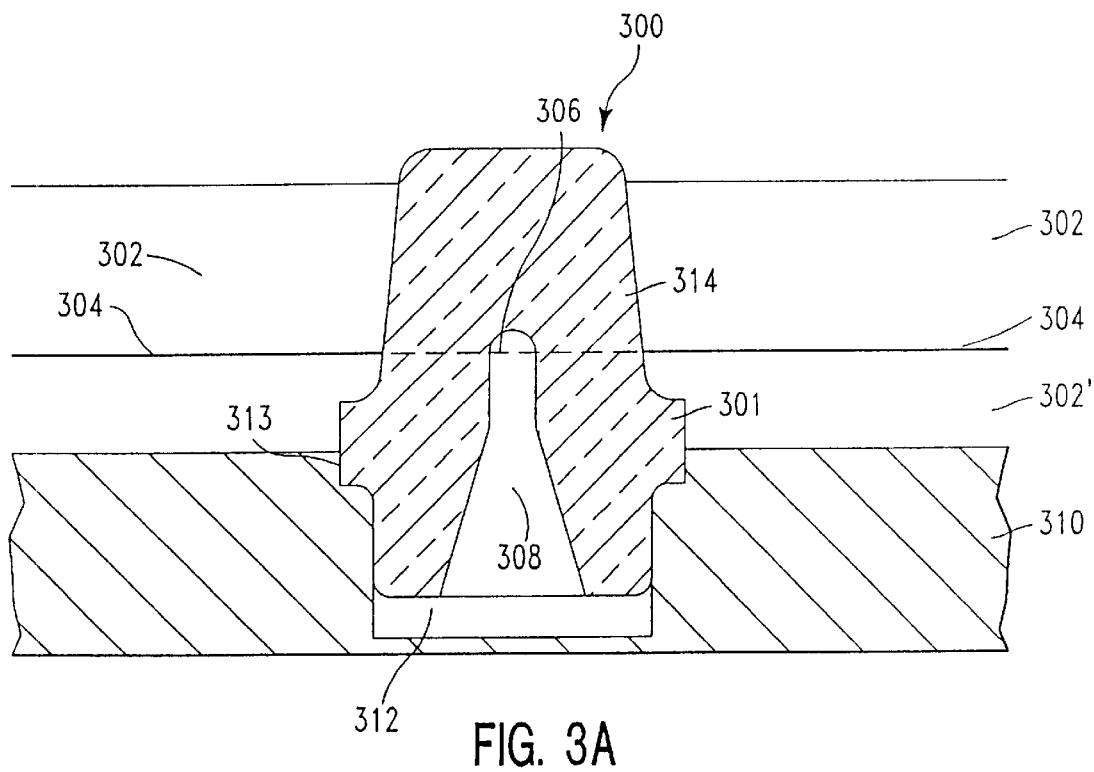
FIG. 3A shows a schematic of one preferred embodiment of the present invention where the dielectric insert shape provides for its retention by an overlying dielectric layer. This invention also provides for a pre-drilled insert where a passageway through the insert is exposed during processing of the overlying dielectric layer.

FIG. 3A is a schematic of a cross-sectional view showing one preferred embodiment of the present invention. A cylindrical dielectric insert 300 is formed with a boss 301 around its outside and a vertically extending cavity 308 at its bottom. The cavity 308 has a blind (closed) upper end. A socket hole 313 is bored from the top of a conductive layer 310 to at least pierce an underlying longitudinal channel 312 machined into the bottom of a conductive layer 310. Preferably, the conductive layer 310 is a pedestal of an electrostatic chuck of the kind shown as 102 in FIG. 1. Pedestal 310 preferably contains a buried channel 312 to facilitate the flow of heat transfer fluid. A socket hole 310 is machined through the upper surface of pedestal 310 to connect with buried channel 312. Dielectric insert 300 is fitted into the socket hole 313 with the bottom of its boss 301 resting on the side portions of socket hole 313, leaving a clearance between the bottom of dielectric insert 300 and the bottom of buried channel 312. Heat transfer fluid (typically cooling gas) can then flow from the gas channel 312 into the vertically extending cavity 308 formed within dielectric insert 300.

After the dielectric insert 300 has been fit into socket hole 313 of conductive layer 310, a dielectric layer 302 is deposited or otherwise applied over the surfaces of both the dielectric insert 300 and conductive layer 310 (typically the principal body or pedestal of an electrostatic chuck 102). The dielectric layer 302 is then processed (typically ground) back to line 304 shown in FIG. 3A, which is below the blind end to the vertically extending cavity 308 of the dielectric insert 300, thereby forming a reduced thickness dielectric layer 302'. Whereby, the cavity 308 is opened at its upper end to form an opening 306, and a heat transfer fluid, such as a cooling gas, can flow from the gas channel 312, through the insert cavity 308, and out of the opening 306 to the surface of the reduced thickness dielectric layer 302'. Once again, the reduced thickness dielectric layer 302' can be processed to form, at its surface, gas distribution grooves connected to opening 306. Preferably, a plurality of dielectric inserts 300 inserted into respective socket holes 313 formed into an annular ring 310 are circumferentially spaced at the openings 202 as shown in FIG. 2A.

Figure 3B:
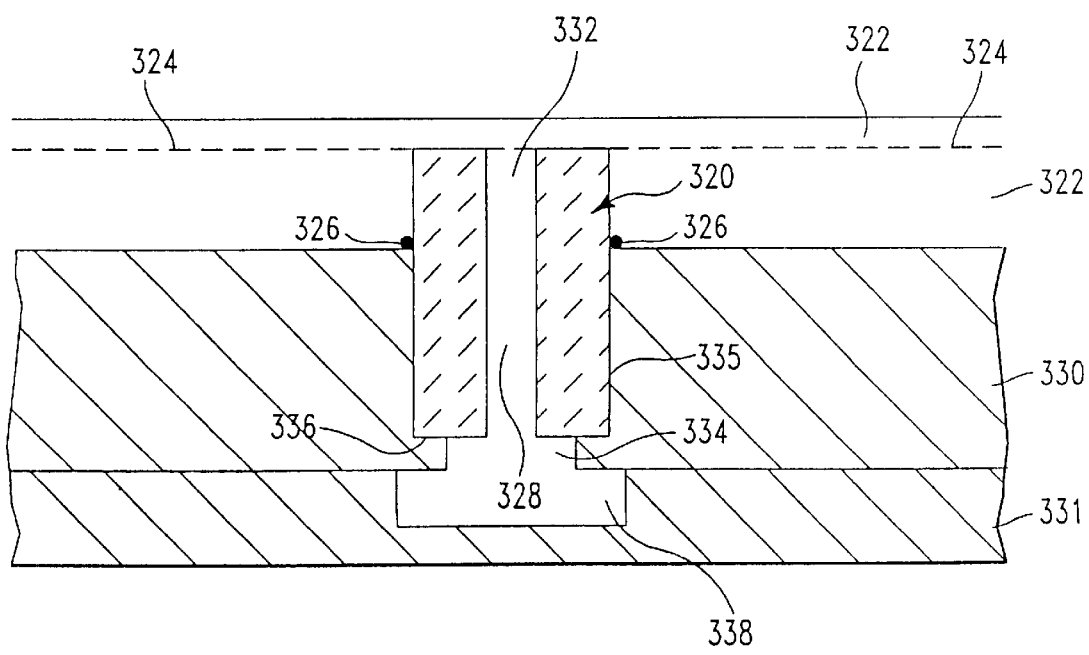
FIG. 3B shows a schematic of a second preferred embodiment of the present invention, where the dielectric insert is held in place by an overlying dielectric layer. A cooling gas distribution hole is drilled through the overlying dielectric layer to connect with a passageway in the insert after application of the overlying dielectric layer. The insert is held in place by the overlying dielectric layer.

FIG. 3B is a schematic of a cross-sectional view of a second preferred embodiment of the present invention. This embodiment includes a tubular dielectric insert sleeve 320 having a pre-drilled center opening 328. That is, the sleeve 320 is a right circular cylinder with an axial passage 328. The passage 328 may either pass completely through the dielectric sleeve 320 or may have an upper blind end (not shown) as does the insert 300 of FIG. 3A.

Conductive layer 330 may be an insert ring similar to the insert ring 110 shown in FIG. 2C. A first socket hole 334 (similar to hole 115 shown in FIG. 2C) is drilled through conductive layer 330 to connect with an underlying gas channel 338 present in pedestal 331 of an electrostatic chuck. A second socket hole 335 is drilled partially through metallic layer 330, to form an annular ledge 336 at the bottom of the socket hole 335. Dielectric insert sleeve 320 is inserted into the socket hole 335, and its lower end preferably rests on the ledge 336. Dielectric insert sleeve 320 may optionally be held within the metallic layer 330 by an annular weld or brazed joint 326 extending around the insert sleeve 320 at the top of the metallic layer 330, or by an interference fit at this location.

After dielectric insert sleeve 320 is fitted into socket hole 335 of conductive layer 330, a dielectric layer 322 is applied over the surface of insert sleeve 320 and conductive layer 330. Subsequently, dielectric layer 322 is processed back to line 324, forming reduced thickness dielectric layer 322" and exposing insert 320 and opening 332 at the top of dielectric insert sleeve 320. If it is desired not to use weld 326 to hold dielectric insert sleeve 320 in place, layer 322 can be processed back so that it leaves dielectric insert sleeve 320 unexposed. Opening 332 must then be drilled through dielectric layer 322 to connect with opening 328 in dielectric insert sleeve 320.

Typically, dielectric insert 300 illustrated in FIG. 3A, and dielectric insert sleeve 320 illustrated in FIG. 3B are used as a plurality of inserts 320 which are spaced around the periphery of an electrostatic chuck 102 of the kind shown in FIG. 2B. The plurality of inserts can be spaced around an annular conductive ring of the kind shown as 110 in FIGS. 2A, 2B, and 2C.

To clearly illustrate the advantages of the basic structure of the present invention over the prior art, reference is made to FIGS. 4 through 7. FIG. 4A illustrates the prior art, while FIGS. 4B through 7E illustrate examples of the preferred embodiments of the present invention. FIGS. 4 through 7 illustrate schematic cross-sectional views of an electrostatic chuck having the general construction shown in FIGS. 2A and 2B. The view illustrated is found at the location shown for a conductive (typically metallic) insert 110 in FIG. 2B. The cross-sectional views for FIGS. 4B through 6C do not include the overlying dielectric layer which forms the upper surface of the electrostatic chuck, but are limited to the underlying substructures so that the substructures can be shown with more clarity. In instances where the dielectric insert of the present invention has a pre-drilled opening and need not depend on the overlying dielectric layer to maintain its position, the dielectric layer can be processed to expose the insert, simultaneously exposing the pre-drilled opening (s). In instances where the dielectric insert depends on overlying dielectric layer to hold it in position, it is necessary to drill an opening through the overlying dielectric layer to connect with the opening in the dielectric insert. When the dielectric insert contains no gas flow openings, these gas flow openings are typically drilled simultaneously with the opening in the overlying dielectric layer.

FIG. 4A illustrates prior art, and shows a schematic of a cross-sectional view of a portion of an electrostatic chuck, including pedestal 400 (typically constructed from aluminum) having a first annular gas flow channel 402 machined in its surface. A second annular channel 404 having a width greater than that of annular channel 402 is machined overlying channel 402 and concentric with channel 402. Into this combination of annular gas flow channel 402 and overlying annular channel 404, a conductive (typically aluminum) annular insert 406 is fitted. Metallic insert 406 is shaped so that it forms, in conjunction with pedestal 400 a gas flow channel 408. Metallic insert 406 optionally includes a pre-drilled plurality of openings 410 spaced around the length of the annular insert 406, which holes lead to its upper surface 412. A dielectric layer (not shown) is applied over the surface 412 of metallic insert 406 and the surface 414 of pedestal 400. Preferably the dielectric layer is comprised of thermally sprayed alumina or sprayed alumina/titania. Processes for application of this thermally sprayed layer are known in the art. The thermal spraying process can be selected from several different methods such as plasma spraying, detonation gun spraying, high velocity oxygen fuel (HVOF) spraying and flame spraying.

The dielectric layer is processed to the desired thickness, and an opening is drilled through the dielectric layer to connect with the opening 410 in metallic insert 406. If metallic insert 406 does not have an opening 410, an opening is drilled through both the dielectric layer and through metallic insert 406 to provide for flow from gas flow channel 402 to the dielectric surface of the electrostatic chuck.

As described before, this method of preparing a gas flow channel to the surface of the electrostatic chuck does not address the problem of the RF plasma environment which seeks the interface between the electrostatic chuck dielectric surface layer and the underlying conductive layer. Frequently the underlying aluminum works its way up the sidewalls of the opening(s) in the dielectric layer, leading to arcing and plasma glow within the opening(s).

Figure 4B:
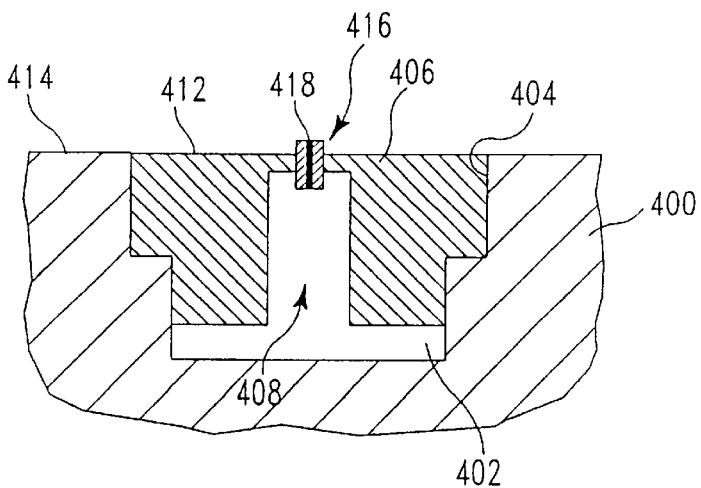
FIG. 4B shows one preferred embodiment of the present invention, where a dielectric insert is used in combination with a metallic gas flow channel of the kind described with reference to FIG. 4A. The dielectric surface layer (not shown) is applied over the surface of the electrostatic chuck, including the conductive metallic annular ring which typically contains a plurality of the dielectric inserts. The dielectric surface layer is then processed back to expose a gas flow opening in the dielectric insert.

FIG. 4B illustrates one preferred embodiment of the present invention where a dielectric insert 416, typically comprised of alumina, is inserted into cavities or holes drilled into annular metallic insert 406. Dielectric insert 416 comprises an internal conduit 418 which permits gas flow from gas flow channel 408 to the surface 412 of metallic insert 406. A layer of dielectric (not shown) is applied over the surface 412 of metallic insert 406 and pedestal 400. The layer of dielectric is processed to the desired thickness, exposing the opening of internal conduit 418 of dielectric insert 416. Dielectric insert 416 now provides a portion of the dielectric surface of the electrostatic chuck while providing electrical isolation of metallic insert 406 from any process plasma which may penetrate the upper portion of gas flow conduit 418. This isolation aids in the prevention of the breakdown of cooling gas as well as in the prevention of arcing between a semiconductor substrate (not shown) supported upon the surface of the electrostatic chuck and the conductive metallic insert 406 used to provide a cooling gas flow channel.

During development of the dielectric inserts of the present invention, we discovered that it is critical that the thermally sprayed ceramic coatings used to provide the dielectric upper surface of an electrostatic chuck (as illustrated in FIGS. 1, 2A, 2B, and 7C through 7F, but not shown in FIGS. 4A through 6C) form submicron shrinkage cracks upon cooling to a deposited dielectric layer. These submicron-sized cracks permit the coating to expand or stretch to conform with the differential in thermal expansion between the dielectric layer and the underlying conductive substrate without forming larger-sized, major cracks or mechanically delaminating from the underlying conductive substrate surface. Formation of major cracks would permit the entry of plasma which damages the underlying conductive substrate and which can also lead to delamination of the ceramic dielectric coating layer from the underlying conductive substrate.

Figure 4C:
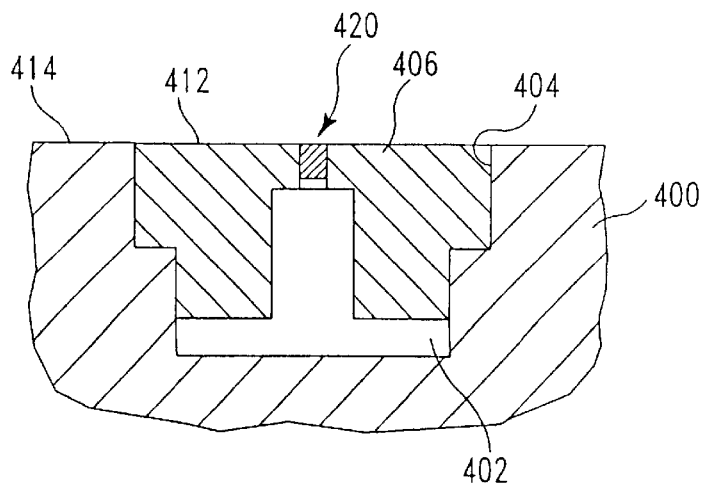
FIG. 4C illustrates a second preferred embodiment of the present invention where the dielectric insert is porous, permitting gas flow from the underlying metallic gas flow channel through the entire insert. Again, a dielectric surface layer (not shown) is applied over the surface of the electrostatic chuck, including the conductive metallic annular ring, which contains a plurality of the dielectric inserts. The dielectric surface layer is processed to the desired thickness and a hole is drilled through the dielectric layer to the surface of the porous insert.

FIG. 4C illustrates another preferred embodiment of the present invention, where the dielectric insert 420 is a porous dielectric, such as alumina having a porosity ranging from about 10% in volume to about 60% in volume, with interconnected openings which form continuous passageways through the dielectric material. Since the shape of the dielectric insert 420 shown in FIG. 4C does not lock the insert in place, after application of the overlying dielectric layer (not shown), the dielectric layer is not processed to expose the insert, but instead, an opening is drilled through the dielectric layer to connect with porous insert 420. It is preferred not to use a straight line of sight through the insert, and by using a porous insert such as 420, improved resistance to penetration of plasma is achieved. When the porous insert 420 is formed using traditional molding and sintering methods, the particles used in the molding or sintering are of the same order of magnitude in size as the porosity and are bonded in more or less random orientation, producing passageways that avoid the straight line of sight configuration.

Figure 5A:
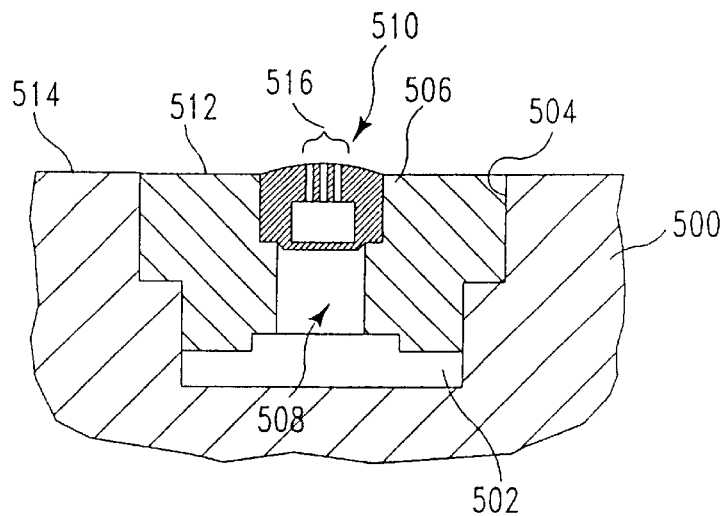
FIG. 5A shows a dielectric insert of the present invention in combination with the metallic gas flow channel, where the dielectric insert comprises multiple openings. The dielectric layer (not shown) is applied over the surface of the dielectric insert and metallic gas flow channel and is processed back (typically ground back) to expose the openings in the dielectric insert.

An additional embodiment of the dielectric insert of the present invention is illustrated in FIG. 5A. This dielectric insert 510 has a plurality of openings 516 leading to gas flow channel 508. Pedestal 500 is machined to have two annular channels 502 and 504 of the kind described with reference to FIG. 4A. A conductive insert 506 (typically metallic) in the form of an annular ring is fitted into annular channels 502 and 504, as illustrated in FIG. 5A. Conductive insert 506 is shaped to form gas flow channel 508 when operating in combination with electrostatic chuck pedestal 500. Dielectric insert 510 is shaped to fit into metallic insert 506. Dielectric insert 510 is shaped to have an upper surface in the form of a dome so that after application of an overlying dielectric layer (not shown), the overlying dielectric layer can be processed back (ground or ablated) to expose the portion of dielectric insert 510 containing openings 516, while leaving insert 510 upper surface adjacent openings 516 covered by the overlying dielectric layer.

Figure 5B:
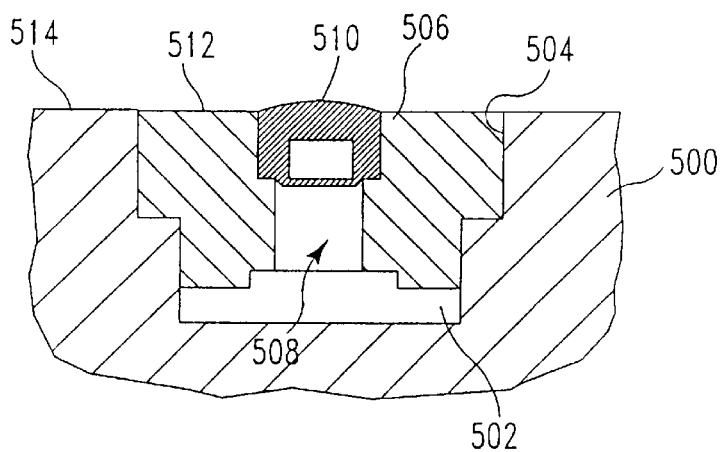
FIG. 5B shows a dielectric insert similar to that shown in FIG. 5A. However, the dielectric insert contains no openings and the openings are drilled through both the dielectric layer (not shown) which is applied over the insert and through the dielectric insert, to connect with the underlying metallic gas flow channel.

A variation of the dielectric insert of FIG. 5A is shown in FIG. 5B. This dielectric insert 520 uses an overlying dielectric layer (not shown) to hold it in place. The overlying dielectric layer is applied over the surface of insert 520, conductive insert 512, and pedestal surface 514. The overlying dielectric layer is processed back to the desired thickness. Then, the gas flow openings through the overlying dielectric layer and dielectric insert 520 are created by drilling through the overlying dielectric layer and dielectric insert 520 to connect with gas flow channel 508.

Figure 5C:
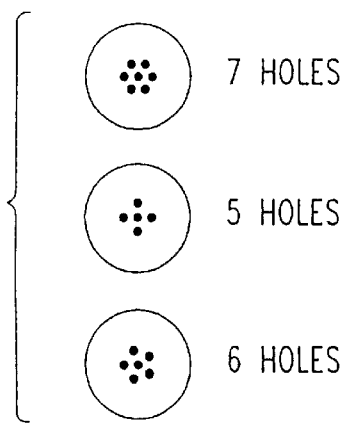
FIG. 5C illustrates three possible hole patterns of the kind which can be used in the inserts of FIGS. 5A and 5B.

FIG. 5C shows typical opening patterns which are used for a dielectric inserts 516 of the kind shown in FIG. 5A.

Another series of dielectric insert designs is shown in FIGS. 6A through 6C. Again, the view is a schematic of a cross-section through an electrostatic chuck in the area of conductive the gas flow channel insert. In FIGS. 6A through 6C, the electrostatic chuck pedestal 600 includes an annular conductive insert shown in section as 606. Pedestal 600 is machined to have two annular channels in its upper surface, as illustrated at 602 and 604. Conductive insert 606 is fitted into the openings created by annular channels 602 and 604, to provide a gas flow path 608.

In FIG. 6A, the dielectric insert of the present invention 610 comprises a non-porous dielectric sleeve 616 surrounding a porous dielectric insert 618. Since dielectric insert 610 is dome shaped on its upper surface, it is possible to use an overlying dielectric layer (not shown) to hold it in place, with the overlying dielectric layer being processed back to expose porous dielectric insert 618. This provides for heat transfer gas flow through channel 608 and porous dielectric filter 618 to the surface of the overlying dielectric layer. Since non-porous dielectric sleeve 616 is configured with a small angle relative to the adjacent surface 612 of conductive insert 606, a contiguous coating without voids or cavities at the interface between dielectric sleeve 616 and surrounding conductive insert 606 is ensured. The upper surface of dielectric insert 616 is roughened to provide good bonding of the overlying dielectric layer to the insert. Typically porous dielectric insert 618 is of the same structure as that described for porous insert 420. Dielectric sleeve 616 is preferably a solid dielectric material of substantially greater tensile strength and modulus, as well as being more homogeneous and uniform in structure than dielectric insert 618. The structure and properties of dielectric sleeve 616 permit a more reliable joint between sleeve 616 and conductive insert 606. This also helps avoid the possibility of formation of a void space between dielectric sleeve 616 and conductive insert 606 which can cause a flaw in the subsequently applied overlying dielectric coating (not shown).

FIG. 6B illustrates a similar dielectric insert 620 where the entire dielectric insert 620 is a porous dielectric. The amount of porosity and the size of the pores in insert 620 are critical in terms of avoiding the formation of plasma glow within dielectric insert 620, which can lead to arcing to a semiconductor substrate supported over the surface of dielectric insert 620. Dielectric insert 620 is of the same general composition and structure as that described for dielectric insert 420.

FIG. 6C shows yet another preferred embodiment of the dielectric insert of the present invention. Dielectric insert 630 comprises a dielectric sleeve 636 and a dielectric center plug 638 where there is an annular opening 640 between sleeve 636 and center plug 638. Center plug 638 is held in place by an adhesive or ceramic bonding material such as fusible glass ceramic, 642 which anchors plug 638 to sleeve 636. By adjusting the size of dielectric center plug 638, the gas flow rate through dielectric insert 630 is adjusted. Again, an overlying dielectric layer (not shown) is applied over the surfaces of electrostatic chuck pedestal 600, surface 612 of conductive insert 606 and over dielectric insert 630. Subsequently the overlying dielectric layer is processed back to expose annular opening 640 in dielectric insert 630 while leaving at least a portion of sleeve 636 entrapped under the overlying dielectric layer.

FIGS. 7A through 7F illustrate a particularly preferred embodiment of the present invention which provides ease in manufacturability.

Figure 7A:
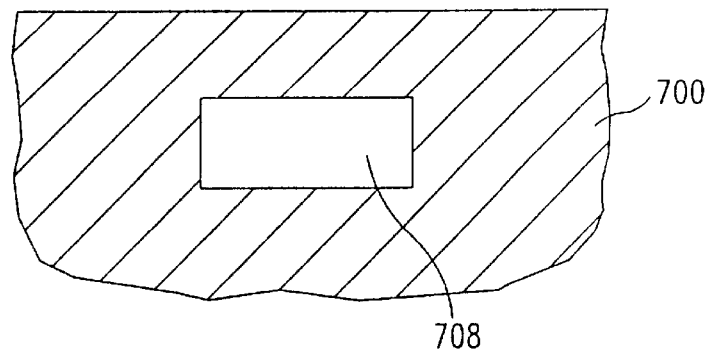
FIGS. 7A through 7F illustrate a method of forming the second preferred embodiment of the present invention which is offers ease in manufacturing.
Figure 7B:
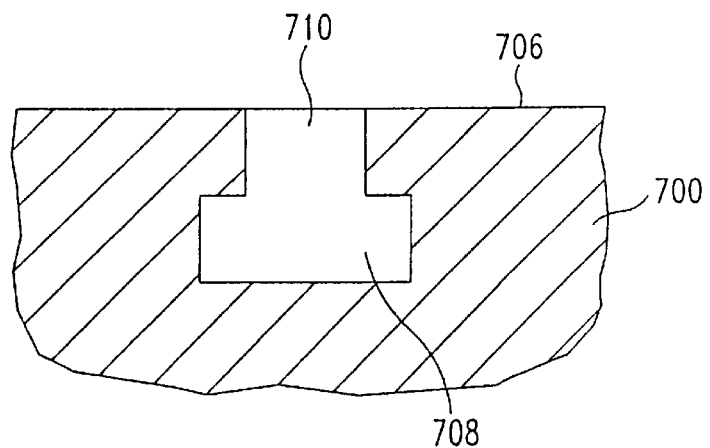
Figure 7C:
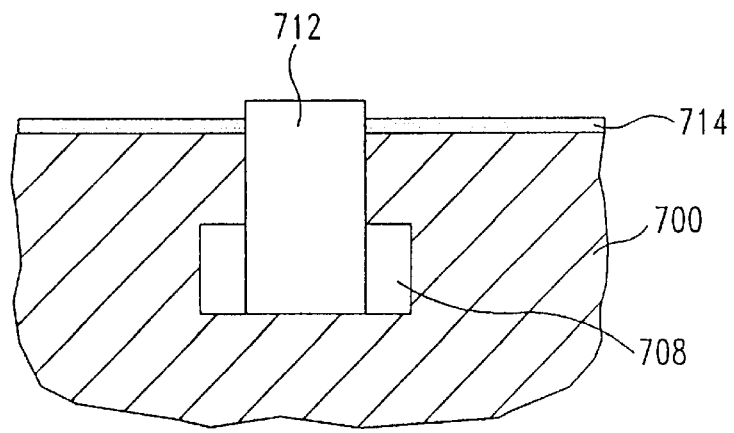
Figure 7D:
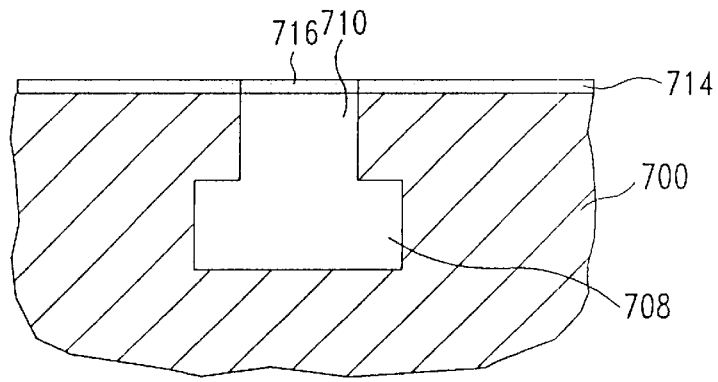
Figure 7E:
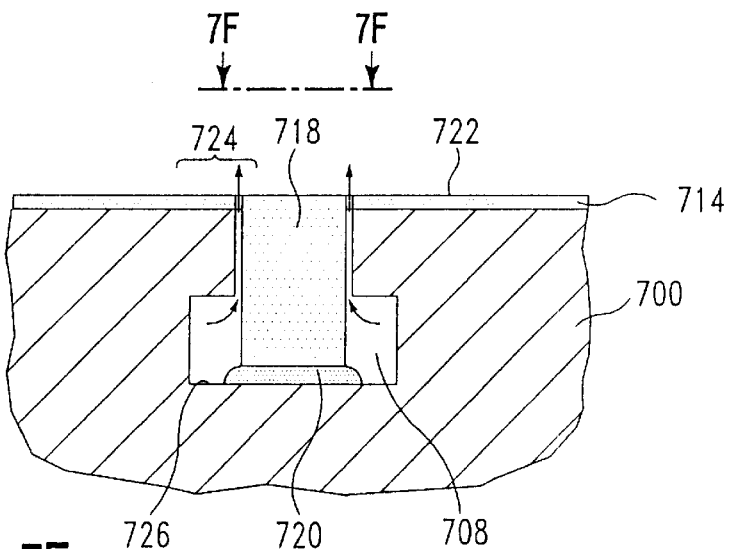
Figure 7F:
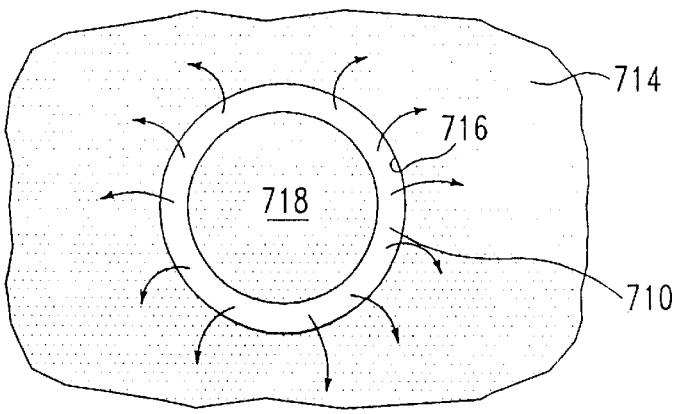

With reference to FIG. 7F, the final structure is one wherein electrostatic chuck pedestal 700 includes at least one heat transfer fluid flow channel 708 which contains dielectric insert 718. Dielectric insert 718 is sized to provide an annular opening for gas flow between heat transfer fluid flow channel 708 and dielectric insert 718.

The dielectric surface layer 714 which overlays pedestal 700 also includes at least one opening, which lies directly over heat transfer fluid flow channel 708 and is sized to provide for the insertion of dielectric insert 718 with an annular space between the opening in layer 714 and insert 718. Thus, heat transfer gas can flow from channel 708 to the surface of dielectric surface layer 714. Dielectric insert 718 is held in place at the bottom of heat transfer fluid flow channel 708 by an adhesive or bonding ceramic 720. It is not critical that dielectric insert 718 be centered in the opening 716 through dielectric surface layer 714, so long as the heat transfer gas can flow through the space between dielectric insert 718 and opening 716.

Fabrication of the preferred embodiment shown in FIGS. 7A through 7F is as follows. As shown in FIG. 7A, at least one buried heat transfer fluid flow channel 708 is prepared in pedestal 700 using techniques known in the art such as welding and brazing. At least one hole or opening 710 is then drilled through the surface 706 of pedestal 700 to connect with heat transfer fluid flow channel 708, as shown in FIG. 7B. The diameter of opening 710 is generally, but not by way of limitation, about 0.080 inches (about 2 mm) or larger. Although this diameter is not critical, the tolerance of the selected diameter should be held within about ±0.005 inches (±0.13 mm).

A space-holding, masking pin 712 is then placed through opening 710 and into heat transfer fluid flow channel 708 so that overlying surface dielectric layer 714 can be applied without the dielectric material entering into opening 710. This is the reason the tolerance of the diameter of opening 710 must be carefully controlled. Masking pin 712 is preferably constructed from a material to which alumina or alumina-titania dielectric coating does not adhere. A Teflon® (trademark of DuPont Company) masking pin 712 has been found to work well. Space-holding masking pin 712 is generally 3 to 6 diameters high, with the controlling feature being functionality. In particular, masking pin 712 is preferably of sufficient height that, after application of a dielectric coating layer 714 (as shown in FIG. 7C), it can be grabbed and pulled out (removed). However, the height of masking pin 712 is preferably such that it does not cast a shadow which prevents application of the dielectric coating in direct contact with masking pin 712 around its entire diameter.

Dielectric coating layer 714 is typically applied to a thickness which is about 10 to 20 mils (0.010 to 0.020 inches, 0.25 mm to 0.50 mm) greater than the desired final thickness of the dielectric layer 714. After application of dielectric layer 714, and removal of masking pin 712, dielectric layer 714 is ground to final thickness and the electrostatic chuck is cleaned of grinding residue. This provides a smooth, flush surface 722 dielectric layer 714 (flat to at least 1.0 mil (0.001 inches or 0.025 mm), which is interpreted to mean that all points on the surface lie within two parallel planes spaced 0.001 inch (0.025 mm) apart, as shown in FIG. 7D. Opening 716 through dielectric layer 714 and opening 710 through pedestal 700 have the diameter typically about 0.080 inches (2 mm) or more, as previously described. This diameter permits ease in removal of any residue, such as the grinding residue. This is an advantage over other embodiments of this invention having smaller diameter openings, which are more difficult to clean.

A measured quantity of adhesive or bonding ceramic 720 is then deposited at the base of heat transfer fluid flow channel 708, directly beneath openings 716 and 710, as shown in FIG. 7E. The thickness of adhesive layer 720 is such that variations in the length of dielectric pin 718 can be compensated for while maintaining a flush top surface 724 which includes the combination of surface dielectric layer 714 and dielectric pin 718. Dielectric pins 718 are typically fabricated from centerless ground ceramic, typically alumina, having a diameter ranging from about 0.003 inches to about 0.005 inches (about 0.076 mm to about 0.102 mm) less than the bore diameter of openings 716 and 710.

Typically dielectric pins 718 are cut to be at least 0.010 inch (0.25 mm) shorter than the bore depth through surface dielectric layer 714 and pedestal 700 to the bottom 726 of heat transfer fluid flow channel 708. Dielectric pins 718 may be cut as much as 0.040 inch (1 mm) undersized in length.

Dielectric pins 718 are inserted through openings 716 and 710 and into adhesive 720 resting on the bottom 726 of heat transfer fluid flow channel 708. It is important that the pins 718 are positioned to provide the flush top surface 724 previously described, and this is accomplished using the depth of penetration of pins 718 into the thickness of adhesive 720 to make up any differences in length of pins 718. It is not critical that dielectric pins 718 be centered within the bore openings 716 and 710, variation is allowable, as shown in FIG. 7F. The heat transfer fluid, typically a gas, flows out of the annular opening between dielectric pin 718 and the openings 710 through pedestal 700 and 716 through dielectric layer 714.

An alternative to using adhesive 710 is to machine an opening into the bottom surface 716 of heat transfer fluid flow channel 708 into which dielectric insert 718 and be interference fitted or staked. However, this is not the most preferred method, since placement of the dielectric insert is more difficult.

For an electrostatic chuck used in combination with an 8 inch diameter semiconductor wafer, wherein there are approximately 180 gas flow pathways including dielectric inserts positioned in a ring around the periphery of the electrostatic chuck, the circular opening 710 in conductive insert 700 typically ranges from about 0.040 to about 0.400 inches (1 mm to about 10 mm in diameter), with the dielectric insert having an outer diameter approximately 0.005 inches (0.123 mm) smaller than the diameter of the cavity. These dimensions are adjusted depending on the kind of heat transfer fluid (cooling gas) used, the pressures used within the processing chamber, and the amount of desired gas flow to the surface of the electrostatic chuck.

The fabrication of this embodiment of the present invention utilizes mature, straightforward manufacturing steps which are not risky to the electrostatic chuck as a whole, which can be reworked up through the final step in fabrication if necessary.

In general, the fabrication techniques used to construct the inserts and structures of the present invention are known in the art, and one skilled in the engineering of materials can make adjustments as necessary in the construction to account for the strength of the various materials which are used. However, there are some techniques which are particularly important which are described herein to enable one skilled in the art to more easily practice the invention.

As previously described, the preferred material of construction for the dielectric inserts is alumina or alumina-titania. This is because the typical electrostatic chuck pedestal is constructed from aluminum, and the conductive insert which comprises the gas flow channel and which is inserted into the electrostatic chuck is also constructed of aluminum. The use of an alumina dielectric insert provides chemical compatibility while utilizing readily available materials. Since electrostatic chucks are used in process environments such as plasma etch and chemical vapor deposition, the chucks can be exposed to process temperature ranges from about −10° C. to about 150° C. With the same temperature range and coefficient of expansion differences between materials in mind, the overlying dielectric surface layer of the electrostatic chuck is preferably constructed from alumina or alumina/titania in the manner previously described which provides micro cracks capable of compensating for expansion differences between the aluminum substrate and the overlying alumina or alumina-titania dielectric coating (typically about 5–2% titania). Preferably this dielectric layer is spray coated over the underlying surfaces. As previously described, the aluminum surfaces to which the alumina dielectric layer is to be applied are typically abraded (roughened) using grit blasting prior to plasma spray coating of the alumina dielectric layer. The roughening provided for mechanical binding of the sprayed alumina layer to the surface of the aluminum.

It has been discovered that by controlling the angle of incidence of the grit which is impacted upon the aluminum surface and by rotating the aluminum pedestal during the grit blasting, it is possible to create grooves which undercut the aluminum surface in a manner which enables the mechanical locking of a dielectric coating subsequently applied over the grooved, undercut aluminum surface. Typically, the aluminum pedestal is fixed to a rotating turntable during grit blasting; the turntable rotates the aluminum pedestal around a centerline. The grit is applied to the surface of the aluminum pedestal using a nozzle which is oriented at an angle relative to the surface of the aluminum pedestal and which travels from near the outer edge of the aluminum pedestal toward the center of the aluminum pedestal. To maintain the depth and the pitch of the grooves created by the grit blasting constant, it is necessary to increase the rate of nozzle travel as the nozzle moves from the outer edge of the aluminum pedestal toward the center of the pedestal. An improvement is peel strength of about 20% or greater has been observed for a dielectric coating of alumina applied by plasma spraying over an aluminum pedestal surface prepared in this manner.

For example, an aluminum pedestal was fixed to a turntable which rotated at about 20 to 30 revolutions per minute (rpm). The angle of incidence of the nozzle relative to surface of the aluminum pedestal was about 70°. The grit particle size was about 60 to 80 mesh, applied using the kind of nozzle commonly used for paint removal via grit blasting. After grit blasting, the height of the grooves was about 0.001 inch (0.025 mm) and the pitch of the grooves was about 0.003 inch (0.075 mm). Subsequent to preparation of the surface of an aluminum pedestal in this manner, a coating of plasma sprayed alumina was applied over the prepared aluminum pedestal surface which was at a temperature of about 60° C. to about 80° C. The plasma sprayed alumina was applied at an angle of about 80° to 90° degrees (nearly perpendicular) relative to the surface of the aluminum pedestal. The plasma-sprayed alumina coating tends to bounce off of surfaces, so it is important to apply the coating at a proper angle relative to the aluminum pedestal surface. After cooling, the peel strength of the plasma sprayed alumina was tested using ASTM methods and found to have improved about 20% over that obtained when aluminum pedestal was prepared using prior art methods.

The following recommendations are general to the methods used to obtain the best results using the present invention. In the embodiments of the invention where the dielectric insert is designed to be in close contact with a cavity or opening within a conductive layer or a conductive insert, typically close contact is achieved using an interference fit or press fit. Care must be taken during the press fitting to apply pressure evenly to the surface of the dielectric insert so that the insert is not fractured. It was found to be advisable to build a tool designed to fit the surface of the dielectric insert and to apply even pressure to that surface during the press fitting. The insert may be tapered toward its bottom edge to permit easier progress into the receiving cavity within the conductive insert. Since an alumina dielectric insert has a relatively hard, sharp edge, it is possible to press this edge into an underlying aluminum cavity with sufficient pressure to cut into the aluminum, providing a press fit at the bottom of the aluminum cavity. However, as mentioned above, the pressure must be applied evenly so as not to crack or fracture the dielectric insert.

In general, a dielectric insert of a solid ceramic must be small in size, about 0.020 to about 0.400 inches in diameter, to avoid mechanical failure from compressive loads applied as a result of temperature cycling during the semiconductor substrate processing. The incompatibility of the thermal coefficient of expansion between the ceramic dielectric and the metal structure of the electrostatic chuck creates these compressive loads during temperature cycling. The small size of the dielectric insert also makes it possible to pre-load the insert into the electrostatic chuck in compression, using an interference fit.

When the dielectric insert is to be in close contact with a conductive surface, with a dielectric coating applied over the combination of surfaces, it necessary that the interface be particularly close to avoid the formation of coating flaws, particularly in the case of a plasma-sprayed dielectric coating. Due to the inability of a plasma sprayed coating to form a dense structure on surfaces, it is preferable to apply the coating at an angle ranging between about 80° and about 90° with respect to the surface being coated. Perpendicular to surface application of a plasma-sprayed dielectric coating is preferred to obtain maximum coating density.

In the case of solid ceramic dielectric inserts, a close fit to the hole or opening into which the insert is placed is obtained using a press fit. Press fit can be accomplished by deforming the metal of the conductive material in contact with the dielectric insert (staking). A dielectric insert can also be held in place by a machined interference fit of about 0.001 inch (0.025 mm) or greater, where the installation of the dielectric insert cuts the metal of the conductive material in contact with the dielectric insert forming an interference fit sufficient to retain the dielectric insert against forces encountered in subsequent handling prior to ceramic coating. A large interference between the insert and surrounding conductive material helps stabilize the overlying dielectric coating applied over the surface of the conductive layer and the insert within that conductive layer. Failure of the interference which holds the insert within the conductive layer can promote thermal expansion cracking of the overlying coating, leading to injection of plasma in the presence of high bias potential and rapid break down of the dielectric coating overlying the joint between the insert and the conductive layer.

After a dielectric insert of the present invention is fitted within a conductive insert (which contains a gas flow cavity), an overlying dielectric layer is applied. Gas flow or gas pressure within the insert may be used during application of the overlying dielectric layer, to prevent plugging of a pre-drilled insert. A plasma sprayed dielectric layer, such as plasma sprayed ceramic is not homogeneous. In the case of alumina, the molten alumina particle contacts the surface to which it is applied, and shrinks as it cools. Since the alumina bonds to its contact surface, it cracks as it cools. The cracking is tolerable so long as the cracks are submicron sized and relatively uniformly distributed over the entire surface. The cracks caused by thermal expansion of the underlying layer cannot propagate so long as the sprayed layer is not homogeneous. It is important to have controlled discontinuities in the ceramic dielectric layer if the chuck is to encounter process temperatures other than that at which the ceramic dielectric layer was sprayed. Typically an alumina dielectric coating is applied at about 40° C. Other dielectric materials having a coefficient of linear expansion near that of aluminum are acceptable. For example, engineering thermoplastics loaded with about 35% to about 45% by volume glass or mineral fillers, to produce a compound which is injection moldable, can be used. The dielectric material can be thermal setting or thermoplastic, so long as it is not notch sensitive and can function at the operational temperatures of the electrostatic chuck.

Preferably openings are created through an overlying alumina dielectric layer using an excimer laser rather than a $CO_2$ laser since the alumina is relatively transparent to the $CO_2$ laser. Openings through an overlying ceramic dielectric layer can also be created by mechanical drilling using a diamond or cubic boron nitride drilling tool.

The above described preferred embodiments are not intended to limit the scope of the present invention, as one skilled in the art can, in view of the present disclosure expand such embodiments to correspond with the subject matter of the invention claimed below.

We claim:

1. An electrostatic chuck, comprising:

(a) a conductive pedestal having a buried gas flow channel;

(b) at least one opening through said pedestal upper surface, where said opening connects with said buried gas flow channel;

(c) at least one insert which is disposed within at least one of said openings, wherein said insert acts to reduce the possibility of plasma penetration into said opening.

2. The electrostatic chuck of claim 1, wherein a dielectric layer overlies at least a portion of said insert.

3. The electrostatic chuck of claim 1, wherein said insert is a metal insert.

4. The electrostatic chuck of claim 1, wherein said insert is a dielectric insert.

5. The electrostatic chuck of claim 4, wherein said dielectric insert is selected from the group consisting of ceramic compositions, engineering thermoplastics, thermosetting resins, filled engineering thermoplastics, filled thermosetting resins, and combinations thereof.

6. The electrostatic chuck of claim 5, wherein said dielectric insert is a ceramic.

7. The electrostatic chuck of claim 6, wherein said ceramic comprises a material selected from the group consisting of alumina and alumina-titania mixtures.

8. The electrostatic chuck of claim 2, wherein said insert is a metal insert.

9. The electrostatic chuck of claim 2, wherein said insert is a dielectric insert.

10. The electrostatic chuck of claim 9, wherein said dielectric insert is selected from the group consisting of ceramic compositions, engineering thermoplastics, thermosetting resins, filled engineering thermoplastics, filled thermosetting resins, and combinations thereof.

11. The electrostatic chuck of claim 10, wherein said dielectric insert is a ceramic.

12. The electrostatic chuck of claim 11, wherein said ceramic comprises a material selected from the group consisting of alumina and alumina-titania mixtures.

* * * * *